(12) United States Patent
Berwick et al.

(10) Patent No.: US 10,483,977 B1
(45) Date of Patent: Nov. 19, 2019

(54) LEVEL SHIFTER

(71) Applicant: TEXAS INSTRUMENTS INCORPORATED, Dallas, TX (US)

(72) Inventors: Jeffrey Wallace Berwick, Sunnyvale, CA (US); Adam Lee Shook, Carrollton, TX (US); Munaf Hussain Shaik, Tucson, AZ (US); Mohit Chawla, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/275,401

(22) Filed: Feb. 14, 2019

Related U.S. Application Data

(60) Provisional application No. 62/682,435, filed on Jun. 8, 2018.

(51) Int. Cl.
*H03K 19/0185* (2006.01)
*H03K 19/0175* (2006.01)

(52) U.S. Cl.
CPC .............. *H03K 19/018521* (2013.01); *H03K 19/017509* (2013.01)

(58) Field of Classification Search
CPC ....... H03K 19/0175; H03K 19/017509; H03K 19/017527; H03K 19/018507; H03K 19/018514; H03K 19/018521; H03K 19/018528
USPC ........................... 326/63, 68, 80, 81; 327/333
See application file for complete search history.

(56) References Cited

U.S. PATENT DOCUMENTS

| | | | |
|---|---|---|---|
| 5,539,334 A | 7/1996 | Clapp, III et al. | |
| 5,821,800 A | 10/1998 | Le et al. | |
| 6,828,825 B2 | 12/2004 | Johnson et al. | |
| 7,227,400 B1 | 6/2007 | Gillespie et al. | |
| 7,236,020 B1 | 6/2007 | Virgil | |
| 8,218,377 B2 | 7/2012 | Tandon et al. | |
| 2006/0145723 A1* | 7/2006 | Hirano | H03K 3/356113 326/68 |
| 2007/0164789 A1* | 7/2007 | Panjwani | H03K 19/018528 326/80 |

\* cited by examiner

*Primary Examiner* — William Hernandez
(74) *Attorney, Agent, or Firm* — John R. Pessetto; Charles A. Brill; Frank D. Cimino

(57) ABSTRACT

A level shifter circuit includes a high voltage latch circuit, a low voltage latch circuit, a high state pulse generator, and a low state pulse generator. The high voltage latch circuit includes a non-inverting output terminal, an inverting output terminal, a high state trigger input terminal, and a low state trigger input terminal. The low voltage latch circuit includes a high state trigger input terminal and a low state trigger input terminal. The high state trigger input terminal is coupled to the inverting output terminal of the high voltage latch circuit. The low state trigger input terminal is coupled to the non-inverting output terminal of the high voltage latch circuit. The high state pulse generator is coupled to the high state trigger input terminal of the high voltage latch circuit. The low state pulse generator is coupled to the low state trigger input terminal of the high voltage latch circuit.

20 Claims, 3 Drawing Sheets

LEVEL SHIFTER

CROSS-REFERENCE TO RELATED APPLICATIONS

The present application claims priority to U.S. Provisional Patent Application No. 62/682,435, filed Jun. 8, 2018, entitled "High Voltage Level Shift with Adaptive Trigger," which is hereby incorporated herein by reference in its entirety.

BACKGROUND

Electronic systems often include circuits that are powered by different power supply voltages, or that require different signal levels to activate circuit components. Such systems include circuitry to translate signals between different voltage levels. For example, some such systems include level shifting circuits (level shifters) are used to translate signals from one voltage level to another. A level shifter may be used to translate a signal from a lower voltage to a higher voltage, or to translate a signal from a higher voltage to a lower voltage.

SUMMARY

In one example, a level shifter circuit, includes a high voltage latch circuit, a low voltage latch circuit, a high state pulse generator, and a low state pulse generator. The high voltage latch circuit includes a non-inverting output terminal, an inverting output terminal, a high state trigger input terminal, and a low state trigger input terminal. The low voltage latch circuit is coupled to the high voltage latch circuit, and includes a high state trigger input terminal and a low state trigger input terminal. The high state trigger input terminal is coupled to the inverting output terminal of the high voltage latch circuit. The low state trigger input terminal is coupled to the non-inverting output terminal of the high voltage latch circuit. The high state pulse generator is coupled to the high state trigger input terminal of the high voltage latch circuit. The low state pulse generator is coupled to the low state trigger input terminal of the high voltage latch circuit.

In another example, a level shifter circuit includes a high voltage latch circuit, a low voltage latch circuit, a high state pulse generator, and a low state pulse generator. The high voltage latch circuit is configured to generate a high voltage output of the level shifter circuit. The low voltage latch circuit is coupled to the high voltage latch circuit, and is configured to change states responsive to a change in state of the high voltage latch circuit. The high state pulse generator is coupled to the high voltage latch circuit and the low voltage latch circuit, and configured to generate a first pulse to set the high voltage latch circuit, and to terminate the first pulse responsive to the low voltage latch being set. The low state pulse generator is coupled to the high voltage latch circuit and the low voltage latch circuit, and is configured to generate a second pulse to reset the high voltage latch circuit, and to terminate the second pulse responsive to the low voltage latch being reset.

In a further example, a level shifter circuit includes a high voltage latch circuit, a low voltage latch circuit, a high state pulse generator, a low state pulse generator, and sample control circuitry. The high voltage latch circuit is configured to generate a high voltage output of the level shifter circuit. The low voltage latch circuit is coupled to the high voltage latch circuit, and is configured to change states responsive to a change in state of the high voltage latch circuit. The high state pulse generator is coupled to the high voltage latch circuit and the low voltage latch circuit, and configured to generate a first pulse to set the high voltage latch circuit, and to terminate the first pulse responsive to the low voltage latch being set. The low state pulse generator is coupled to the high voltage latch circuit and the low voltage latch circuit, and is configured to generate a second pulse to reset the high voltage latch circuit, and to terminate the second pulse responsive to the low voltage latch being reset. The sample control circuitry is coupled to the low voltage latch circuit, the high state pulse generator, and the low state pulse generator. The sample control circuitry is configured to enable a state change of the low voltage latch circuit responsive to generation of a pulse by the high state pulse generator or the low state pulse generator.

BRIEF DESCRIPTION OF THE DRAWINGS

For a detailed description of various examples, reference will now be made to the accompanying drawings in which.

DETAILED DESCRIPTION

Figure 1:
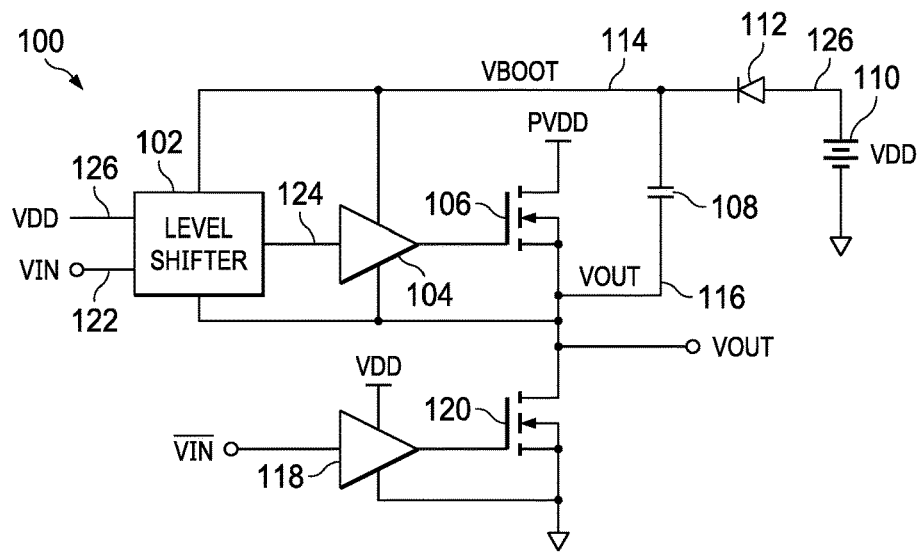
FIG. 1 shows a block diagram for an example system that controls an N-channel metal oxide semiconductor field effect transistor (MOSFET) using a level shifter circuit powered by bootstrap voltage in accordance with the present disclosure.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Some high voltage switching applications use an N-channel metal oxide semiconductor field effect transistor (MOSFET) to switch high voltage due to the smaller size of the N-channel MOSFET relative to a P-channel MOSFET having similar channel resistance. Such applications employ bootstrapped MOSFET gate drive that keeps a bootstrap capacitor charged several volts above the high voltage switched by the MOSFET. A level shifter translates ground-referenced input signal to the high voltages needed to control the MOSFET. Because the charge stored on the bootstrap capacitor is limited, the current drawn from the bootstrap capacitor by the level shifter should be minimized.

Some level shifters use floating latch stages cascoded with high voltage P-channel MOSFETs in the high voltage domain. The cascodes work well down to about 3 volts (V), but in battery powered electronics, voltage supplies of 3 V or less are common. Cascode headroom requirements prevent operation below about 2.5 V.

Pulse-driven level shifters drive P-channel MOSFET bootstrap-referenced trigger devices that control a high voltage latch. High speed and high noise immunity require that high trigger currents be pulled from the bootstrap capacitor. Accordingly, the pulses controlling the latch must be as narrow as possible. Unfortunately, the duration of the pulses needed to change the state of the latch varies with voltage, process, and temperature. For example, a 10:1 ratio of pulse width is commonly needed to accommodate the strongest and weakest conditions. Thus, using a fixed pulse width wastes bootstrap current in normal operating conditions.

The level shifter circuits disclosed herein include a pulse generator that is controlled by feedback from the high voltage latch that generates the level shifted output. State change in the high voltage latch terminates the pulse signal provided by the pulse generator so that the pulse duration is only as long as is needed to change the state of the high voltage latch. Thus, the width of the pulse, and the current drawn from the bootstrap capacitor by operation of the level shifter are minimized. Implementations of the level shifter circuits include a low voltage latch that changes state responsive to state change of the high voltage latch. The pulse generators terminate pulse output responsive to state change in the low voltage latch.

FIG. 1 shows a block diagram for an example system 100 in accordance with the present disclosure. The system 100 includes a level shifter circuit 102, a gate driver 104, an N-channel MOSFET 106, a bootstrap capacitor 108, a diode 112, a voltage source 110, a gate driver 118, and an N-channel MOSFET 120. Implementations of the system 100 may be included in circuitry for a variety of applications. For example, a class-D amplifier includes an implementation of the system 100 to drive a loudspeaker.

The N-channel MOSFET 120 and the gate driver 118 are referenced to ground, and the gate driver 118 drives an inverted version of the input signal VIN to the N-channel MOSFET 120. The level shifter circuit 102, the gate driver 104 and the N-channel MOSFET 106 are referenced to VOUT 116. The bootstrap capacitor 108, the diode 112 and voltage source 110 produce a bootstrap voltage (VBOOT) 114 that powers the level shifter circuit 102 and the gate driver 104, and allows the level shifter circuit 102 and the gate driver 104 to provide a control voltage higher than VOUT 116 to turn on the N-channel MOSFET 106. In some implementations of the system 100, the voltage source 110 is a battery and/or generates the voltage (VDD) 126 that powers low voltage circuitry of the system 100. The level shifter circuit 102 shifts the input signal VIN from a ground referenced signal to the power rails defined by VOUT 116 and VBOOT 114. The level shifter circuit 102 includes adaptive pulse generation circuitry that reduces the current drawn from the bootstrap capacitor 108.

Figure 2:
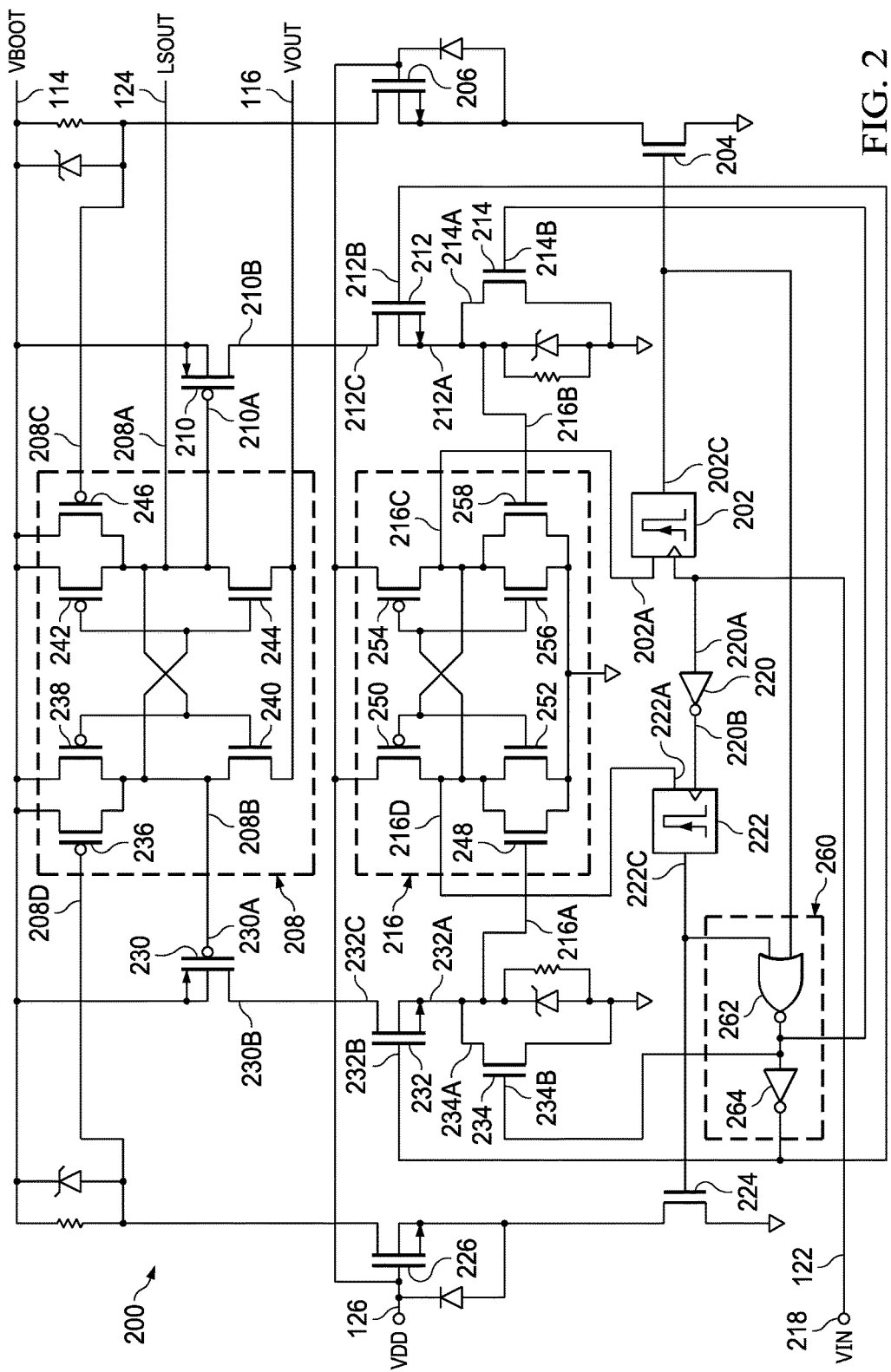
FIG. 2 shows a schematic diagram for an example level shifter circuit that includes adaptive pulse generation in accordance with the present disclosure.

FIG. 2 shows a schematic diagram for an example level shifter circuit 200 that includes adaptive pulse generation in accordance with the present disclosure. The level shifter circuit 200 is an implementation of the level shifter circuit 102. The level shifter circuit 200 includes a high state pulse generator 202, a low state pulse generator 222, a high voltage latch 208, and a low voltage latch 216. The high state pulse generator 202 is coupled to the level shifter input terminal 218 to generate a pulse at a rising edge of the signal received at the level shifter input terminal 218. The low state pulse generator 222 is coupled to the level shifter input terminal 218 via the inverter 220 to generate a pulse at a falling edge of the signal received at the level shifter input terminal 218. An input 220A of the inverter 220 is coupled to the level shifter input terminal 218, and an output 220B of the inverter 220 is coupled to the low state pulse generator 222. The high voltage latch 208 is powered by VBOOT 114 and generates the high voltage output (LSOUT) 124 of the level shifter circuit 200. The high state pulse generator 202 (output 202C) is coupled to a high state trigger input terminal 208C of the high voltage latch 208, and generates a pulse to set the high voltage latch 208 via the transistor 204 and the transistor 206. The low state pulse generator 222 (output 222C) is coupled to a low state trigger input terminal 208D of the high voltage latch 208, and resets the high voltage latch 208 via the transistor 224 and the transistor 226.

The high voltage latch 208 includes a pair of cross-coupled inverters. A first of the inverters includes transistor 238 and transistor 240. A second of the inverters includes transistor 242 and transistor 244. The high state pulse generator 202 generates a pulse when the signal VIN 122 transitions from logic low voltage to logic high voltage. The pulse turns on the transistor 204, which enables current flow in the transistor 206 and turns on the transistor 246 to set the high voltage latch 208. Similarly, the low state pulse generator 222 generates a pulse when the signal VIN 122 transitions from logic high voltage to logic low voltage. The pulse turns on the transistor 224, which enables current flow in the transistor 226 and turns on the transistor 236 to reset the high voltage latch 208.

The duration of the pulses generated by the high state pulse generator 202 and the low state pulse generator 222 is a function of the time needed for the high voltage latch 208 to change state responsive to the pulses. The low voltage latch 216 is coupled to the high voltage latch 208 and changes state responsive to change in state of the high voltage latch 208. The outputs of the low voltage latch 216 are fed back to the high state pulse generator 202 and the low state pulse generator 222 to reset the pulses generated by the high state pulse generator 202 and the low state pulse generator 222. More specifically, a pulse termination input 202A of the high state pulse generator 202 is coupled to the high state output terminal 216C of the low voltage latch 216 and a pulse termination input 222A of the low state pulse generator 222 is coupled to the low state output terminal 216D of the low voltage latch 216.

The low voltage latch 216 includes a pair of cross-coupled inverters. A first of the inverters includes transistor 250 and transistor 252. A second of the inverters includes transistor 254 and transistor 256. State change in the low voltage latch 216 is enabled by the sample control circuitry 260. The sample control circuitry 260 is coupled to the low voltage latch 216, the high state pulse generator 202 and the low state pulse generator 222, and generates an enable signal that combines the outputs of the high state pulse generator 202 and the low state pulse generator 222. In the example sample control circuitry 260 shown in FIG. 2, the sample control circuitry 260 includes a NOR gate 262 that combines the outputs of the high state pulse generator 202 and the low state pulse generator 222, and an inverter 264 to produce an output that is complementary to the output of the NOR gate 262. Other implementations of the sample control circuitry 260 include different logical circuitry. When the high state pulse generator 202 or the low state pulse generator 222 generates a pulse, the sample control circuitry 260 enables sampling of the outputs of the high voltage latch 208 by the low voltage latch 216, which in turn enables a state change of the low voltage latch circuit 216.

The sample control circuitry 260 is coupled to a transistor 212, a transistor 214, a transistor 232, and a transistor 234 to control operation of the low voltage latch 216. The transistor 214 and the transistor 234 are coupled to the output of the NOR gate 262. More specifically, the transistor 214 includes a first terminal 214B that is coupled to the high state pulse generator 202 and the low state pulse generator 222 through the sample control circuitry 260, and a second terminal 214A that is coupled to the low state trigger input terminal 216B of the low voltage latch 216. The transistor 234 includes a first terminal 234B that is coupled to the high state pulse generator 202 and the low state pulse generator 222 through the sample control circuitry 260, and a second terminal 234A that is coupled to the high state trigger input terminal 216A of the low voltage latch 216. When neither the high state pulse generator 202, nor the low state pulse generator 222 is generating a pulse, the transistor 214 and the transistor 234 are turned on to pull the high state trigger input terminal 216A and the low state trigger input terminal 216B, the gate terminal of the transistor 248 and the gate terminal of the transistor 258, low and disable state change in the low voltage latch 216.

When either the high state pulse generator 202 or the low state pulse generator 222 is generating a pulse, the transistor 214 and the transistor 234 are turned off to allow the low voltage latch 216 to sample the outputs of the high voltage latch 208. The low voltage latch 216 is coupled to the high voltage latch 208 via a transistor 212, a transistor 210, a transistor 232, and a transistor 230. The high state trigger input terminal 216A of the low voltage latch 216 is coupled to the inverting output terminal 208B of the high voltage latch 208 via the transistor 230 and the transistor 232. The low state trigger input terminal 216B of the low voltage latch 216 is coupled to the non-inverting output terminal 208A of the high voltage latch 208 via the transistor 210 and the transistor 212. More specifically, the terminal 210A of the transistor 210 is coupled to the non-inverting output terminal 208A of the high voltage latch 208, and the terminal 210B of the transistor 210 is coupled to the terminal 212C of the 212 (the terminal 212C of the transistor 212 is coupled to the high voltage latch 208). The terminal 212A of the transistor 212 is coupled to the low state trigger input terminal 216B of the low voltage latch 216 and the terminal 214A of the transistor 214, and the terminal 212B of the transistor 212 is coupled to the high state pulse generator 202 and the low state pulse generator 222 via the sample control circuitry 260 (the inverter 264 of the sample control circuitry 260). Similarly, the terminal 230A of the transistor 230 is coupled to the inverting output terminal 208B of the high voltage latch 208, and the terminal 230B of the transistor 230 is coupled to the terminal 232C of the transistor 232 (the terminal 232C of the transistor 232 is coupled to the high voltage latch 208). The terminal 232A of the transistor 232 is coupled to the high state trigger input terminal 216A of the low voltage latch 216 and the terminal 234A of the transistor 234, and the terminal 232B of the transistor 232 is coupled to the high state pulse generator 202 and the low state pulse generator 222 via the sample control circuitry 260 (the inverter 264 of the sample control circuitry 260).

When either the high state pulse generator 202 or the low state pulse generator 222 is generating a pulse, the transistor 212 and the transistor 232 are turned on to connect the low voltage latch 216 to the high voltage latch 208. The state of the high voltage latch 208 is set responsive the pulse, and either the transistor 210 or the transistor 230 is turned on. If the non-inverting output terminal 208A is set to a logic high level, then the transistor 230 is turned on. If the non-inverting output terminal 208A is set to a logic low level, then the transistor 210 is turned on. The one of the transistor 210 or the transistor 230 that is turned on passes a voltage to the low voltage latch 216 (via either the transistor 212 or the transistor 232) that changes the state of the low voltage latch 216, and in turn terminates the pulse generated by the high state pulse generator 202 or the low state pulse generator 222. Termination of the pulse turns off the transistor 212 and the transistor 232 and turns on the transistor 214 and the transistor 234 to disable further state change of the low voltage latch 216 until a next pulse is generated by the high state pulse generator 202 or the low state pulse generator 222.

Figure 3:
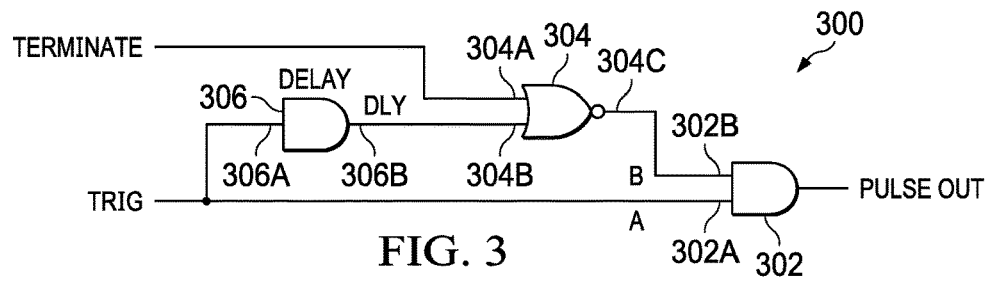
FIG. 3 shows a schematic diagram for an example pulse generation circuit in accordance with the present disclosure.

FIG. 3 shows a schematic diagram for an example pulse generation circuit 300 in accordance with the present disclosure. The pulse generation circuit 300 is an implementation of the high state pulse generator 202 or the low state pulse generator 222. The pulse generation circuit 300 includes an AND gate 302, a NOR gate 304, and a delay circuit 306. The AND gate 302 includes an input 302A that is coupled to a level shifter input terminal 218 of the level shifter circuit 200 (or the output 220B of the inverter 220), and an input 302B that is coupled the output 304C of the NOR gate 304.

The NOR gate 304 includes an input 304A that is coupled to an output of the low voltage latch 216. For example, the input 304A is coupled to the high state output terminal 216C or the low state output terminal 216D. The NOR gate 304 also includes an input 304B that is coupled to the output 306B of the delay circuit 306. The input 306A of the delay circuit 306 is coupled to the input 302A of the AND gate 302 and the level shifter input terminal 218 of the level shifter circuit 200 (or the output of the inverter 220).

Figure 4:
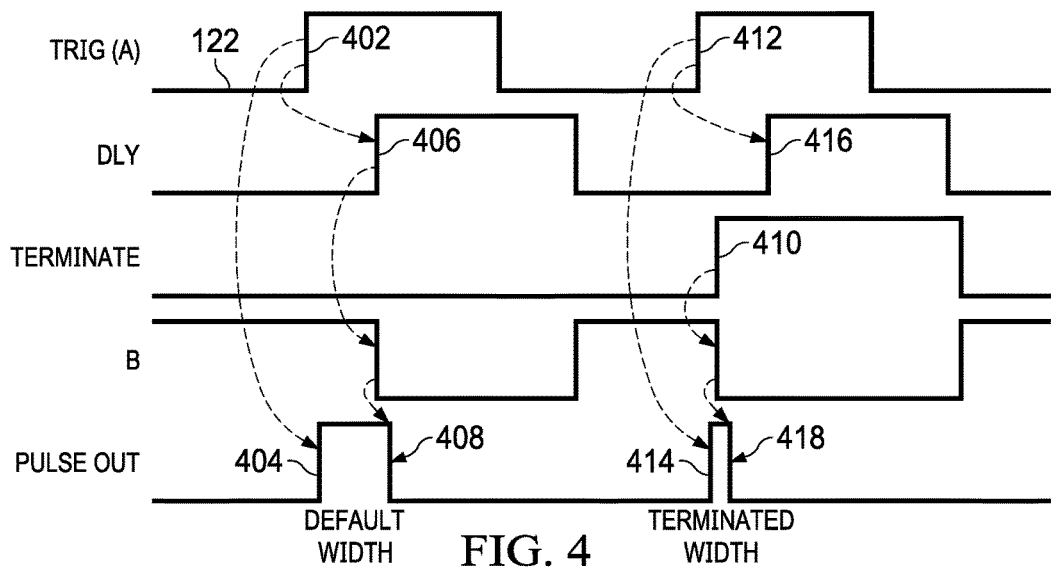
FIG. 4 shows an example timing diagram for operation of the pulse generation circuit of FIG. 3.

FIG. 4 shows an example timing diagram for operation of the pulse generation circuit 300. At time 402 the signal VIN 122 transitions from a logic low level to a logic high level. As a result, both the input 302A and the input 302B of the AND gate 302 are at a logic high level, and the AND gate 302 initiates a pulse 408 at time 404. The signal VIN 122 is delayed by the delay circuit 306, and at time 406 the delayed version of the signal VIN 122 is provided at the input 304B of the NOR gate 304, which in turn sets the input 302B of the AND gate 302 to a logic low level and terminates the pulse 408 generated at the output of the AND gate 302. Thus, the duration of the pulse 408 is determined by the time delay provided by the delay circuit 306 because no feedback from the low voltage latch circuit 216 is received to terminate the pulse 408.

At time 412 the signal VIN 122 again transitions for a logic low level to a logic high level. As a result, both the input 302A and the input 302B of the AND gate 302 are at a logic high level, and the AND gate 302 initiates a pulse 418 at time 414. At time 410, the high voltage latch 208 and low voltage latch 216 have changed state responsive to the pulse 418, and the change in the output of the low voltage latch 216 at time 410 is provided at the input 304A of the NOR gate 304, which in turn sets the input 302B of the AND gate 302 to a logic low level and terminates the pulse 418 generated at the output of the AND gate 302. Thus, the duration of the pulse 418 is determined by the time needed to change the state of the high voltage latch 208 and the low voltage latch 216 responsive to the pulse 418.

Figure 5:
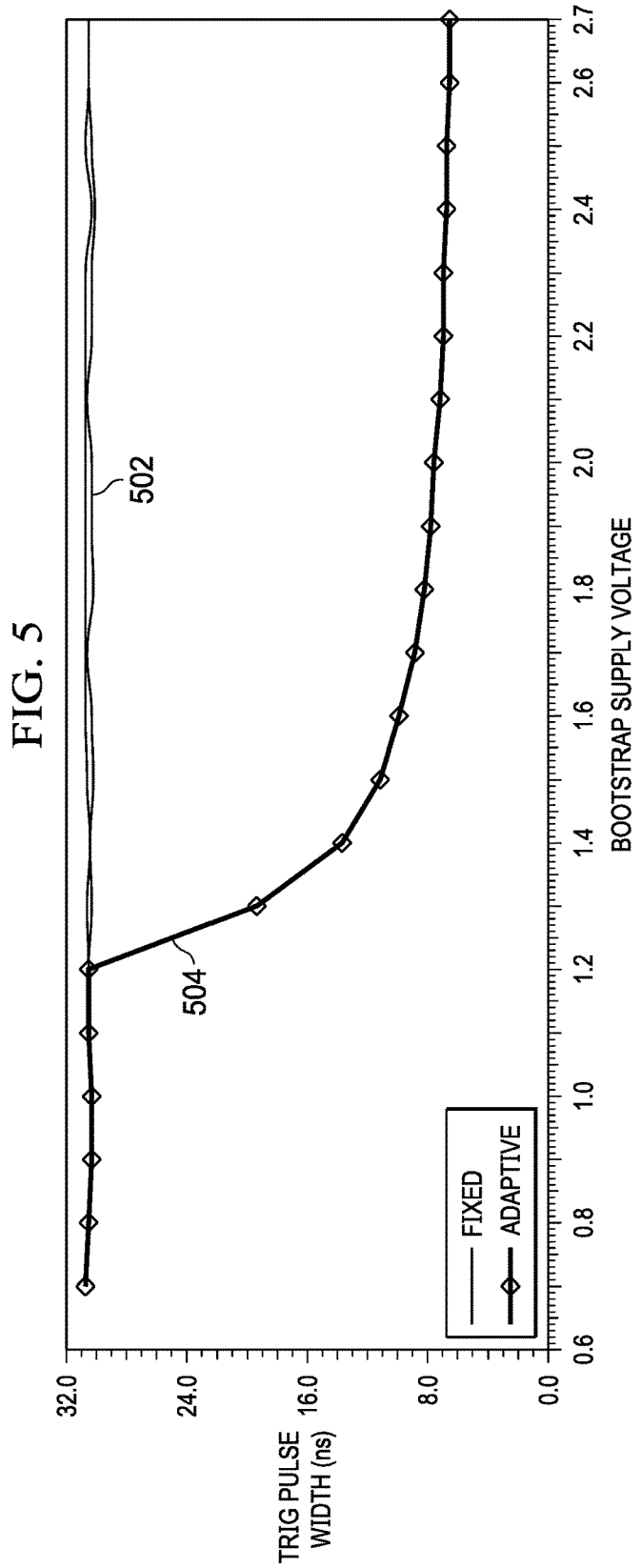
FIG. 5 shows a graph illustrating example pulse times for a fixed pulse width level shifter circuit and a level shifter circuit that includes adaptive pulse generation in accordance with the present disclosure.

FIG. 5 shows a graph illustrating example pulse times for a fixed pulse width level shifter circuit and a level shifter circuit in accordance with the present disclosure. In FIG. 5, the bootstrap supply voltage powering the level shifter circuit 200 is shown as ranging from about 0.7 V to 2.7 V. With bootstrap supply voltages below a minimum functional value of about 1.2 V, the pulse width needed to change the state of the high voltage latch 208 is set to about 31 nanosecond (ns) (e.g., by the delay circuit 306). Accordingly, in a level shifter circuit that employs a fixed pulse width, the pulse width 502 is set to about 31 ns for all bootstrap voltages.

In the level shifter circuit 200, pulse width 504 is reduced below about 1.2 V as the time required to change the state of the high voltage latch 208 decreases with increasing bootstrap supply voltage. Accordingly, the current drawn from the bootstrap supply by the level shifter circuit 200 over the illustrated range of voltages is lower than the current drawn from the bootstrap supply over the illustrated range of voltages using a fixed pulse width.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A level shifter circuit, comprising:
a high voltage latch circuit comprising:
   a non-inverting output terminal;
   an inverting output terminal;
   a high state trigger input terminal; and
   a low state trigger input terminal;
a low voltage latch circuit coupled to the high voltage latch circuit, and comprising:
   a high state trigger input terminal coupled to the inverting output terminal of the high voltage latch circuit; and
   a low state trigger input terminal coupled to the non-inverting output terminal of the high voltage latch circuit;
a high state pulse generator coupled to the high state trigger input terminal of the high voltage latch circuit; and
a low state pulse generator coupled to the low state trigger input terminal of the high voltage latch circuit.

2. The level shifter circuit of claim 1, wherein:
the high state pulse generator comprises a pulse termination input coupled to a high state output terminal of the low voltage latch circuit; and
the low state pulse generator comprises a pulse termination input coupled to a low state output terminal of the low voltage latch circuit.

3. The level shifter circuit of claim 1, further comprising sample control circuitry coupled to the low voltage latch circuit, the high state pulse generator, and the low state pulse generator.

4. The level shifter circuit of claim 3, further comprising:
a first transistor comprising:
   a first terminal coupled to the high state trigger input terminal of the low voltage latch circuit; and
   a second terminal coupled to the low state pulse generator and the high state pulse generator; and
a second transistor comprising:
   a first terminal coupled to the low state trigger input terminal of the low voltage latch circuit; and
   a second terminal coupled to the low state pulse generator and the high state pulse generator.

5. The level shifter circuit of claim 4, further comprising:
a third transistor comprising:
   a first terminal coupled to the first terminal of the first transistor;
   a second terminal coupled to the low state pulse generator and the high state pulse generator; and
   a third terminal coupled to the high voltage latch circuit;
a fourth transistor comprising:
   a first terminal coupled to the first terminal of the second transistor;
   a second terminal coupled to the low state pulse generator and the high state pulse generator; and
   a third terminal coupled to the high voltage latch circuit.

6. The level shifter circuit of claim 5, further comprising:
a fifth transistor comprising:
   a first terminal coupled to the high voltage latch circuit; and
   a second terminal coupled to the third terminal of the third transistor; and
a sixth transistor comprising:
   a first terminal coupled to the high voltage latch circuit; and
   a second terminal coupled to the third terminal of the fourth transistor.

7. The level shifter circuit of claim 1, wherein the high state pulse generator comprises:
an AND gate comprising a first input coupled to a level shifter input terminal;
a NOR gate comprising:
   an output coupled to a second input of the AND gate;
   a first input coupled to the low voltage latch circuit; and
a delay circuit comprising:
   an input coupled to the first input of the AND gate; and
   an output coupled to a second input of the NOR gate.

8. The level shifter circuit of claim 1, wherein the low state pulse generator comprises:
an inverter comprising an input coupled to a level shifter input terminal;
an AND gate comprising a first input coupled to an output of the inverter;
a NOR gate comprising:
   an output coupled to a second input of the AND gate; and
   a first input coupled to the low voltage latch circuit;
a delay circuit comprising:
   an input coupled to the first input of the AND gate; and
   an output coupled to a second input of the NOR gate.

9. A level shifter circuit, comprising:
a high voltage latch circuit configured to generate a high voltage output of the level shifter circuit;
a low voltage latch circuit coupled to the high voltage latch circuit, and configured to change states responsive to a change in state of the high voltage latch circuit;
a high state pulse generator coupled to the high voltage latch circuit and the low voltage latch circuit, and configured to:
   generate a first pulse to set the high voltage latch circuit; and
   terminate the first pulse responsive to the low voltage latch being set; and a low state pulse generator coupled to the high voltage latch circuit and the low voltage latch circuit, and configured to:
  generate a second pulse to reset the high voltage latch circuit; and
  terminate the second pulse responsive to the low voltage latch being reset.

10. The level shifter circuit of claim 9, wherein:
the high state pulse generator comprises:
  an AND gate comprising a first input coupled to a level shifter input terminal;
  a NOR gate comprising:
    an output coupled to a second input of the AND gate; and
    a first input coupled to the low voltage latch circuit; and
  a delay circuit comprising:
    an input coupled to the first input of the AND gate; and
    an output coupled to a second input of the NOR gate; and
the low state pulse generator comprises:
  an inverter comprising an input coupled to the level shifter input terminal;
  an AND gate comprising a first input coupled to an output of the inverter;
  a NOR gate comprising:
    an output coupled to a second input of the AND gate; and
    a first input coupled to the low voltage latch circuit; and
  a delay circuit comprising:
    an input coupled to the first input of the AND gate; and
    an output coupled to a second input of the NOR gate.

11. The level shifter circuit of claim 9, wherein:
the high voltage latch circuit comprises:
  a non-inverting output terminal;
  an inverting output terminal;
  a high state trigger input terminal coupled to an output of the high state pulse generator; and
  a low state trigger input terminal coupled to an output of the low state pulse generator; and
the low voltage latch circuit comprises:
  a high state trigger input terminal coupled to the inverting output terminal of the high voltage latch circuit; and
  a low state trigger input terminal coupled to the non-inverting output terminal of the high voltage latch circuit.

12. The level shifter circuit of claim 11, wherein:
the high state pulse generator comprises a pulse termination input coupled to a high state output terminal of the low voltage latch circuit; and
the low state pulse generator comprises a pulse termination input coupled to a low state output terminal of the low voltage latch circuit.

13. The level shifter circuit of claim 9, further comprising sample control circuitry coupled to the low voltage latch circuit, the high state pulse generator, and the low state pulse generator.

14. The level shifter circuit of claim 13, further comprising:
a first transistor comprising:
  a first terminal coupled to the high state trigger input terminal of the low voltage latch circuit; and
  a second terminal coupled to the low state pulse generator and the high state pulse generator; and
a second transistor comprising:
  a first terminal coupled to the low state trigger input terminal of the low voltage latch circuit; and
  a second terminal coupled to the low state pulse generator and the high state pulse generator.

15. The level shifter circuit of claim 14, further comprising:
a third transistor comprising:
  a first terminal coupled to the first terminal of the first transistor;
  a second terminal coupled to the low state pulse generator and the high state pulse generator; and
  a third terminal coupled to the high voltage latch circuit; and
a fourth transistor comprising:
  a first terminal coupled to the first terminal of the second transistor;
  a second terminal coupled to the low state pulse generator and the high state pulse generator; and
  a third terminal coupled to the high voltage latch circuit.

16. The level shifter of claim 15, further comprising:
a fifth transistor comprising:
  a first terminal coupled to the high voltage latch circuit; and
  a second terminal coupled to the third terminal of the third transistor; and
a sixth transistor comprising:
  a first terminal coupled to the high voltage latch circuit; and
  a second terminal coupled to the third terminal of the fourth transistor.

17. A level shifter circuit, comprising:
a high voltage latch circuit configured to generate a high voltage output of the level shifter circuit;
a low voltage latch circuit coupled to the high voltage latch circuit, and configured to change states responsive to a change in state of the high voltage latch circuit;
a high state pulse generator coupled to the high voltage latch circuit and the low voltage latch circuit, and configured to:
  generate a first pulse to set the high voltage latch circuit; and
  terminate the first pulse responsive to the low voltage latch being set;
a low state pulse generator coupled to the high voltage latch circuit and the low voltage latch circuit, and configured to:
  generate a second pulse to reset the high voltage latch circuit; and
  terminate the second pulse responsive to the low voltage latch being reset; and
sample control circuitry coupled to the low voltage latch circuit, the high state pulse generator, and the low state pulse generator, wherein the sample control circuitry is configured to enable a state change of the low voltage latch circuit responsive to generation of a pulse by the high state pulse generator or the low state pulse generator.

18. The level shifter circuit of claim 17, wherein:
the high voltage latch circuit comprises:
  a non-inverting output terminal;
  an inverting output terminal;

a high state trigger input terminal coupled to an output of the high state pulse generator; and a low state trigger input terminal coupled to an output of the low state pulse generator; and the low voltage latch circuit comprises:

a high state trigger input terminal coupled to the inverting output terminal of the high voltage latch circuit; and a low state trigger input terminal coupled to the non-inverting output terminal of the high voltage latch circuit.

19. The level shifter circuit of claim 17, further comprising:

a first transistor comprising:

a first terminal coupled to the high state trigger input terminal of the low voltage latch circuit; and a second terminal coupled to the low state pulse generator and the high state pulse generator; and a second transistor comprising:

a first terminal coupled to the low state trigger input terminal of the low voltage latch circuit; and a second terminal coupled to the low state pulse generator and the high state pulse generator.

20. The level shifter circuit of claim 19, further comprising:

a third transistor comprising:

a first terminal coupled to the first terminal of the first transistor;

a second terminal coupled to the low state pulse generator and the high state pulse generator; and a third terminal coupled to the high voltage latch circuit;

a fourth transistor comprising:

a first terminal coupled to the first terminal of the second transistor;

a second terminal coupled to the low state pulse generator and the high state pulse generator; and a third terminal coupled to the high voltage latch circuit;

a fifth transistor comprising:

a first terminal coupled to the high voltage latch circuit; and a second terminal coupled to the third terminal of the third transistor; and a sixth transistor comprising:

a first terminal coupled to the high voltage latch circuit; and a second terminal coupled to the third terminal of the fourth transistor.

* * * * *